US012292770B2

(12) United States Patent
Tunks et al.

(10) Patent No.: US 12,292,770 B2
(45) Date of Patent: May 6, 2025

(54) INDEPENDENT ACTIVE COOLING AND HEATING CONTROL LOOP PER COMPONENT

(71) Applicant: Dell Products L.P., Round Rock, TX (US)

(72) Inventors: Eric Michael Tunks, Austin, TX (US); Joseph Andrew Vivio, Seattle, WA (US); Ayedin Nikazm, Austin, TX (US); John Randolph Stuewe, Round Rock, TX (US); Tyler Baxter Duncan, Austin, TX (US)

(73) Assignee: DELL PRODUCTS L.P., Round Rock, TX (US)

( * ) Notice: Subject to any disclaimer, the term of this patent is extended or adjusted under 35 U.S.C. 154(b) by 637 days.

(21) Appl. No.: 17/577,621

(22) Filed: Jan. 18, 2022

(65) Prior Publication Data

US 2023/0229212 A1 Jul. 20, 2023

(51) Int. Cl.
*G06F 1/20* (2006.01)
*G05B 15/02* (2006.01)
*H05K 7/20* (2006.01)

(52) U.S. Cl.
CPC ............ *G06F 1/206* (2013.01); *G05B 15/02* (2013.01); *G06F 1/20* (2013.01); *H05K 7/20736* (2013.01)

(58) Field of Classification Search
USPC ........................................ 700/300
See application file for complete search history.

(56) References Cited

U.S. PATENT DOCUMENTS

| 6,400,567 | B1 * | 6/2002 | McKeen | H05K 7/20145 361/695 |
| 6,925,828 | B1 * | 8/2005 | Gerstner | H05K 7/20209 361/695 |
| 2010/0139290 | A1 * | 6/2010 | Leblond | H04N 23/661 454/251 |
| 2010/0226090 | A1 * | 9/2010 | Gilliland | H05K 7/20736 361/691 |
| 2014/0036442 | A1 * | 2/2014 | Giannoglou | H05K 7/186 361/695 |
| 2016/0262286 | A1 * | 9/2016 | Lin | H05K 7/20181 |
| 2018/0268872 | A1 * | 9/2018 | Gale | G06F 1/206 |
| 2023/0345664 | A1 * | 10/2023 | Zanft | H05K 7/20209 |

FOREIGN PATENT DOCUMENTS

DE 10305501 A1 * 9/2004 ............. G06F 1/203

* cited by examiner

*Primary Examiner* — Emilio J Saavedra
(74) *Attorney, Agent, or Firm* — Chamberlain, Hrdlicka, White, Williams & Aughtry; Aly Z. Dossa

(57) ABSTRACT

An improved method and system for heating and cooling an electronic device, when internal temperatures are below safe operating ranges. To do so, the system selectively heats or cools each zone of the electronic device. This may be done by individual heaters and/or cooling system for each separate zones. Alternatively, or in addition too, the system can selectively open and close baffles, causing fresh ambient air to enter and/or recirculate heated air in a device's enclosure. This keeps sensitive components of the computing device, such as processors and memory from suffering damage, by operating them at temperatures that are either too cold or too warm.

3 Claims, 12 Drawing Sheets

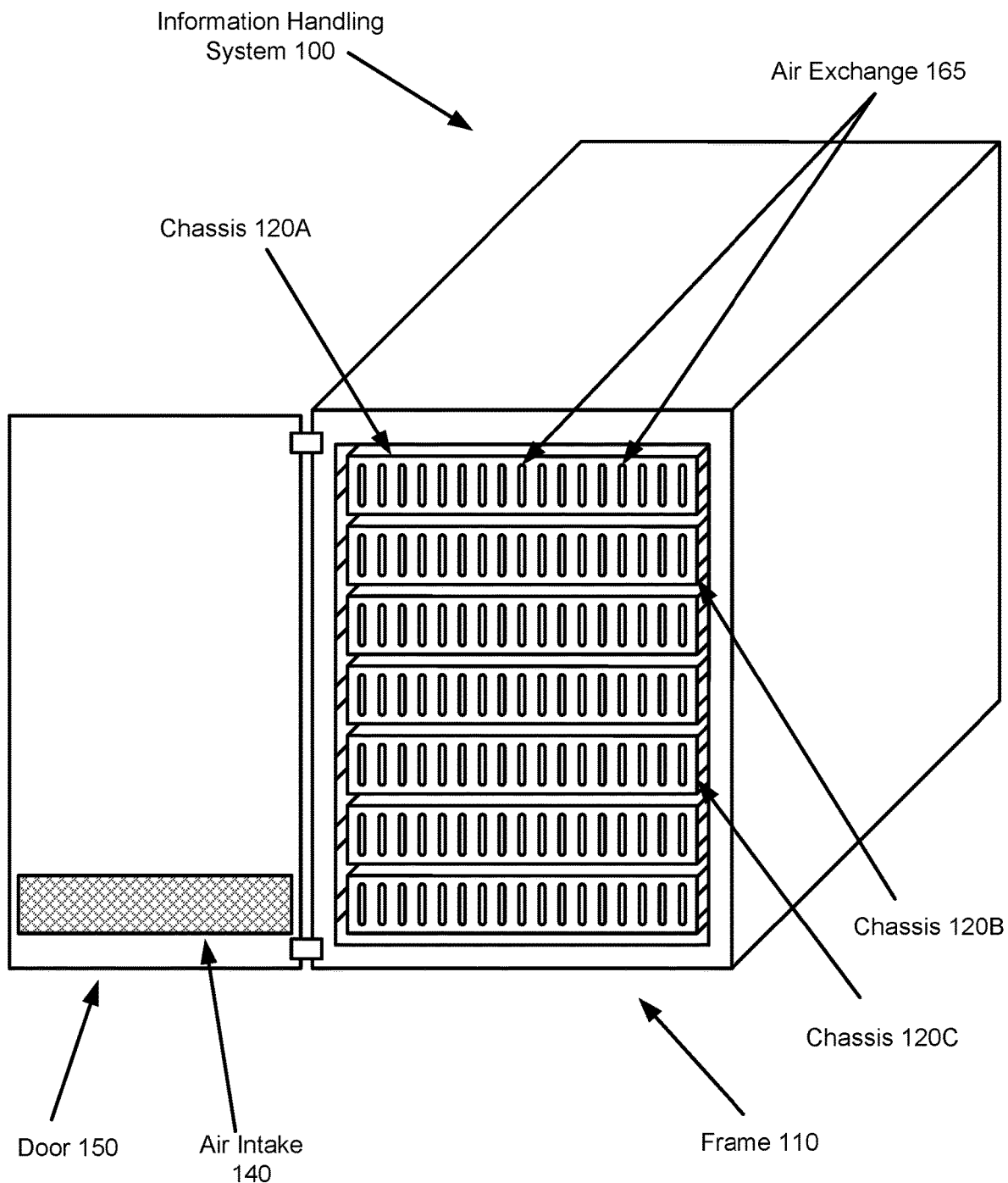
FIG. 1.1

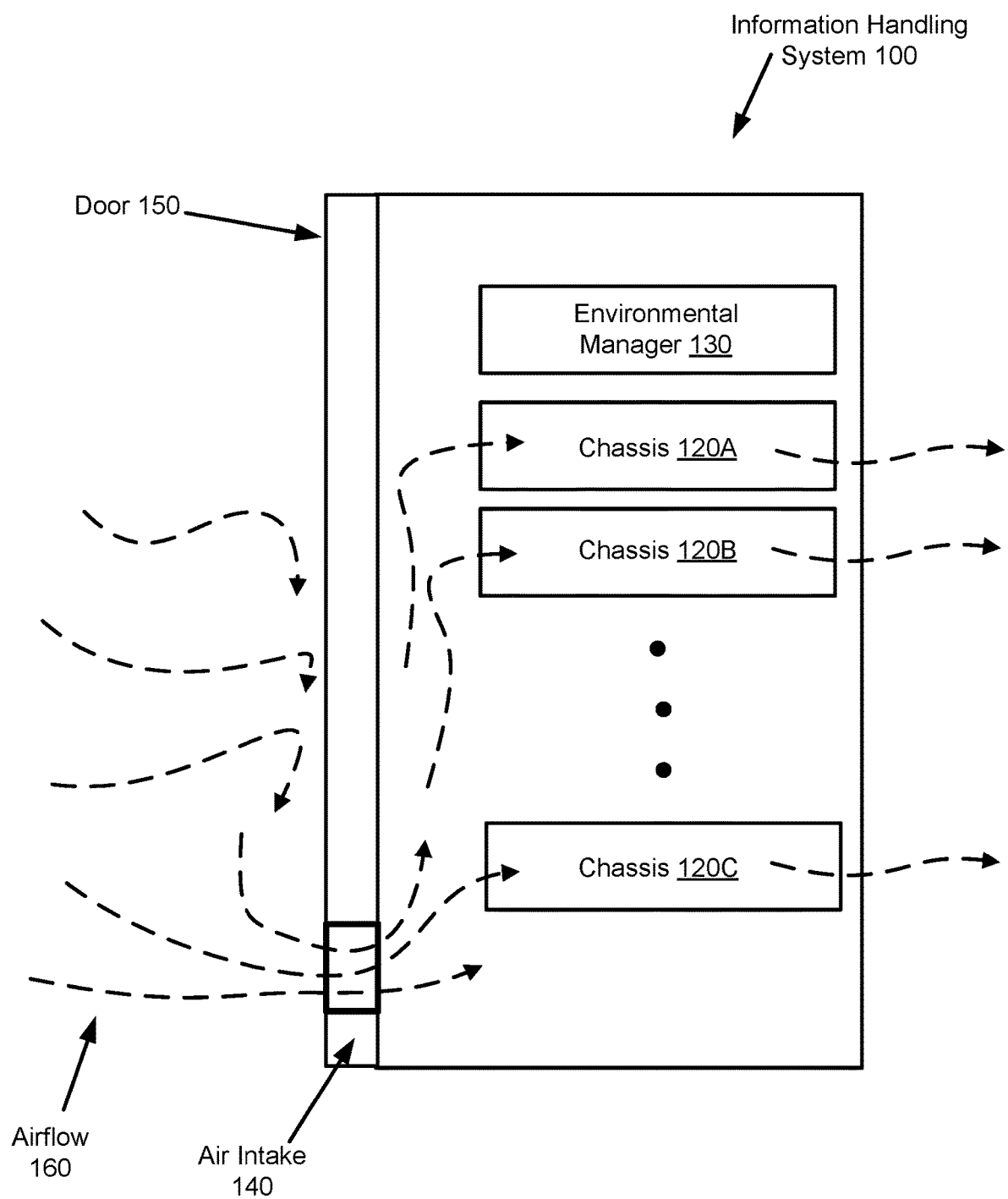
FIG. 1.2

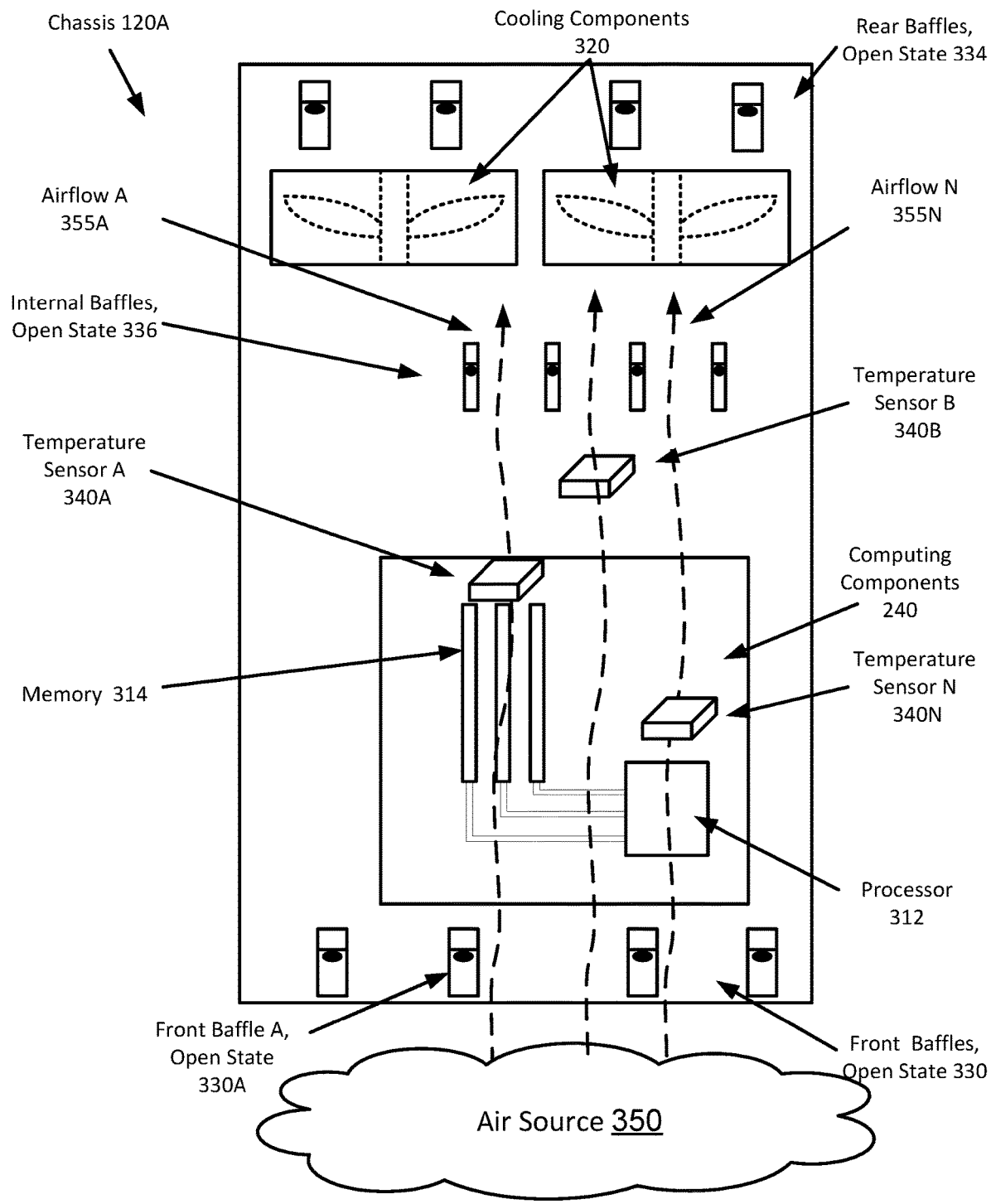
FIG. 3.1

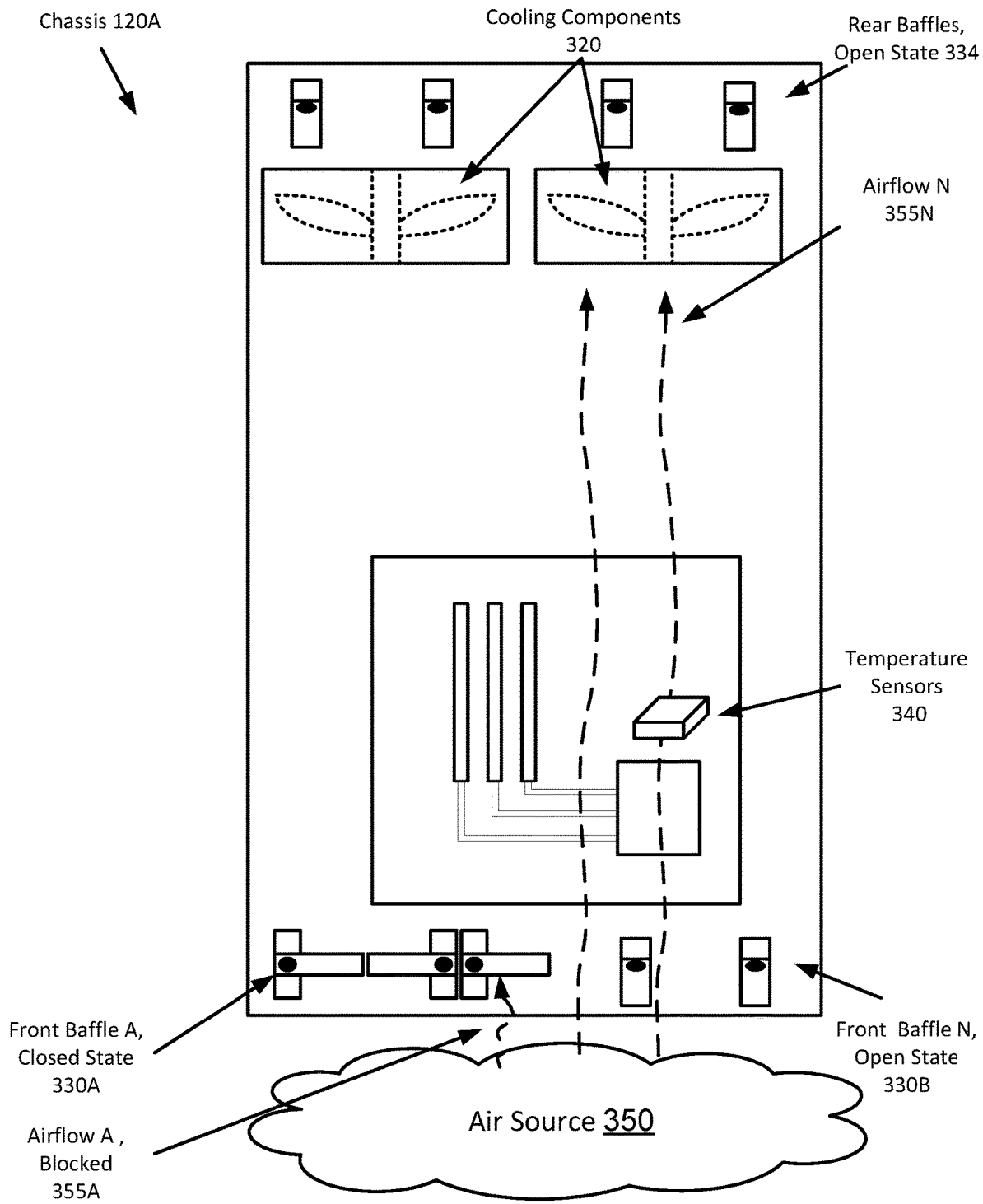
FIG. 3.2

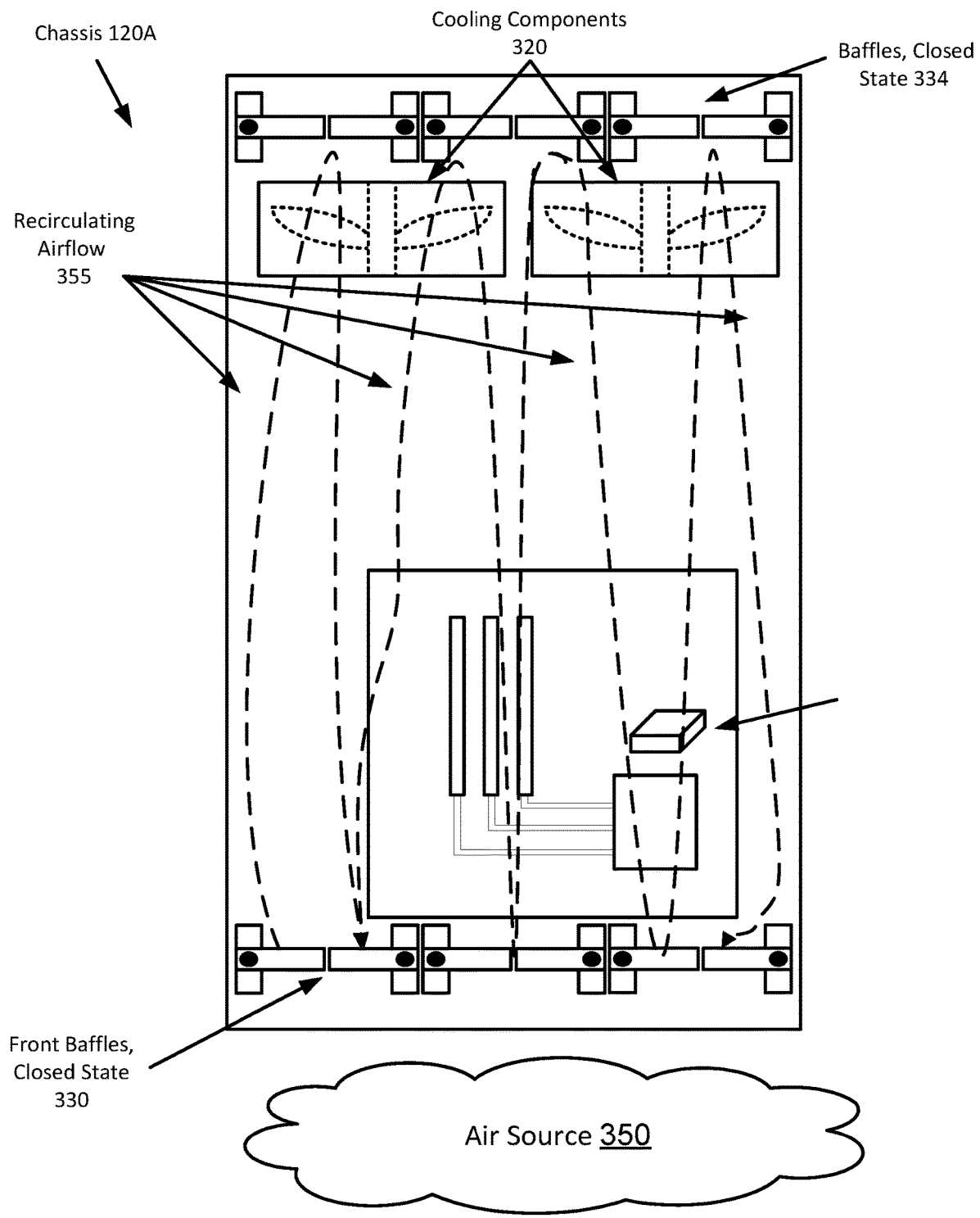
FIG. 3.3

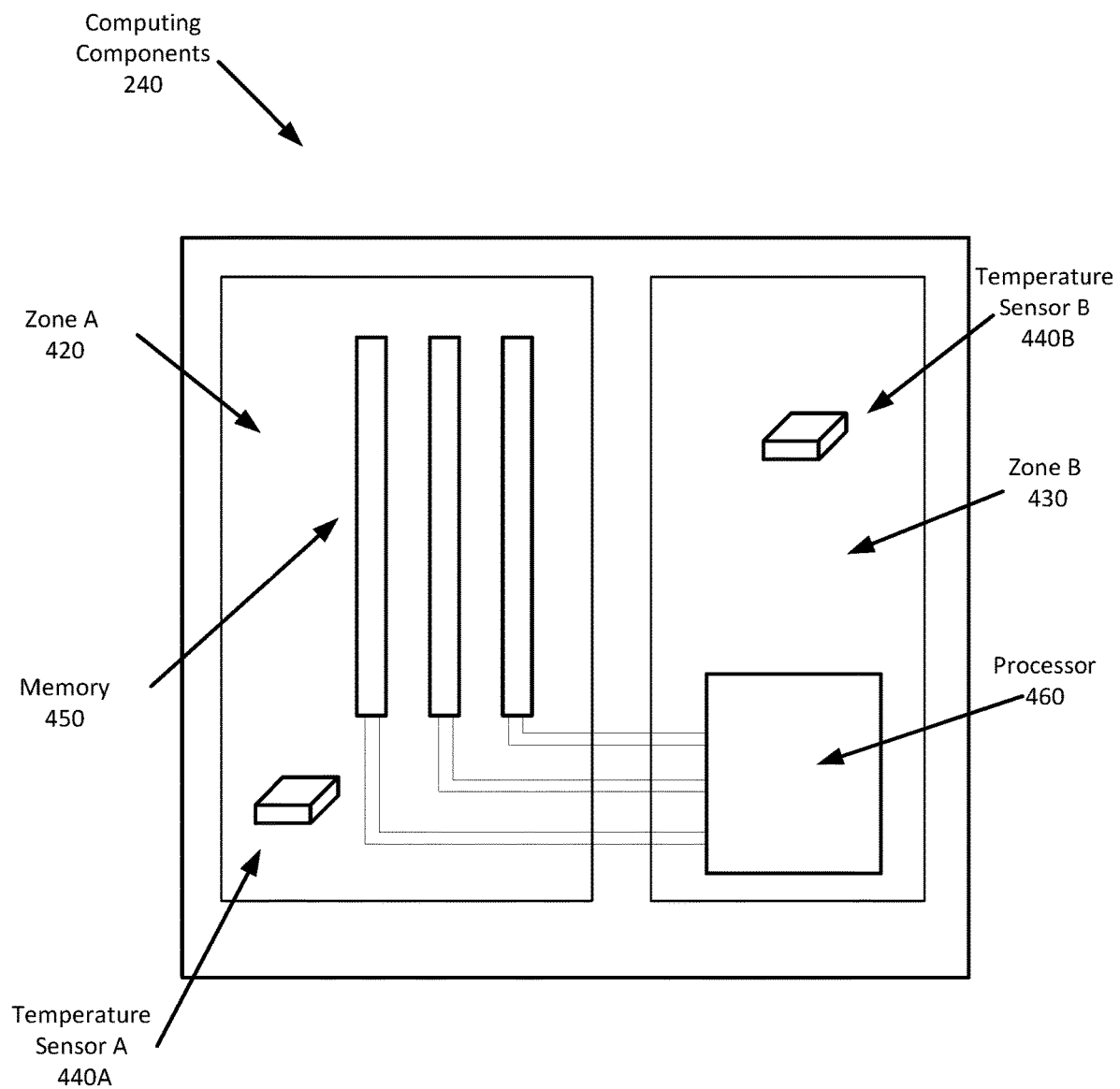
FIG. 4.1

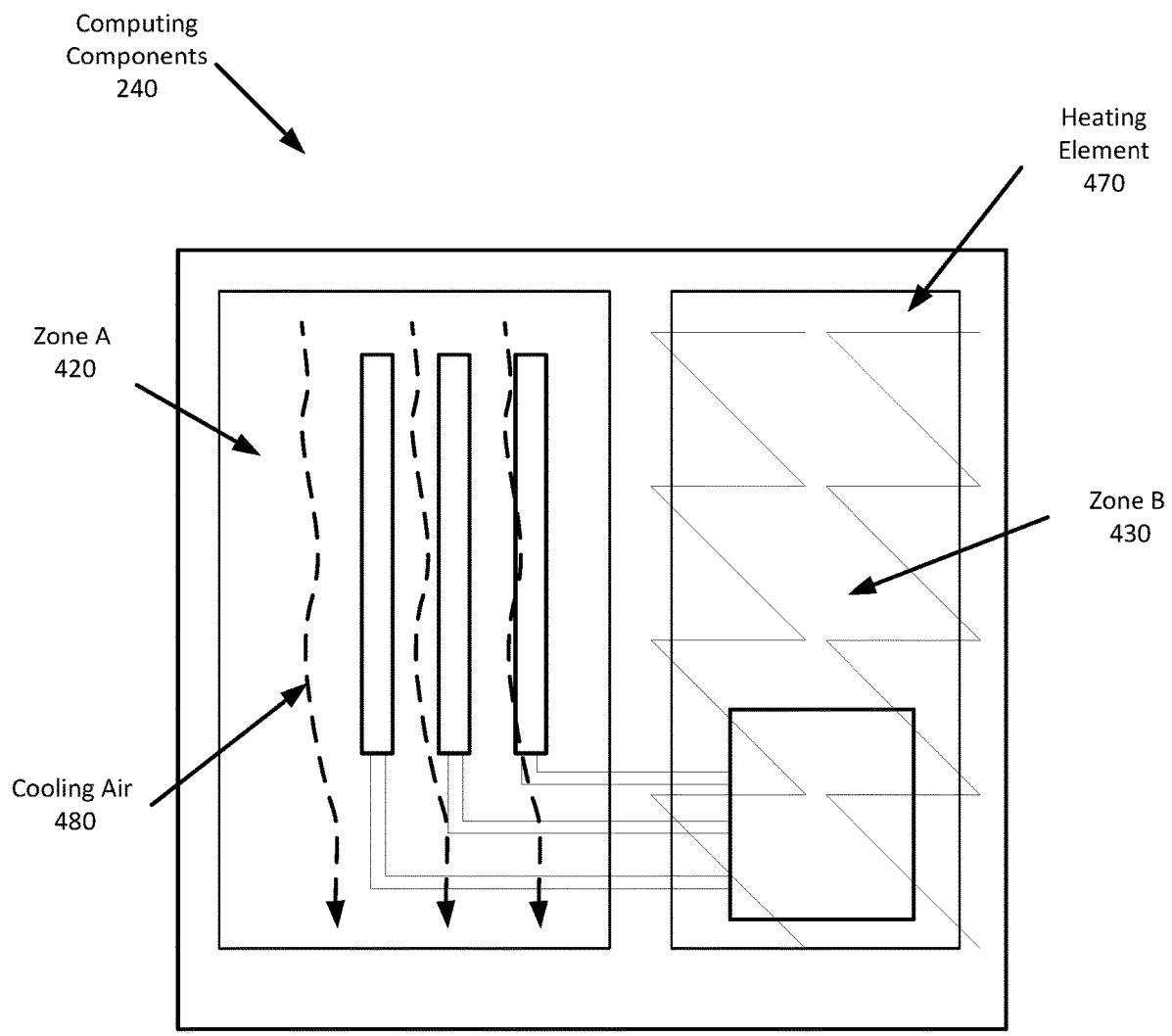
FIG. 4.2

INDEPENDENT ACTIVE COOLING AND HEATING CONTROL LOOP PER COMPONENT

BACKGROUND

As networking and communication technologies advance, there is an increased need for providing datacenters closer to the end users or on the "Edge". These datacenters are typically smaller than that of large "Cloud" based datacenters, but still have requirements that are similar to those of large Cloud based datacenters.

The information handling system mounted in the datacenters are generally designed for a 10° C. to 35° C. environment. However, Edge or Telco datacenters often have minimal to no heating or cooling capabilities. This can result in information handling systems needing to operate bellow or above the range which they are designed for, which can be harmful to components such as processors in the information handling system. Potentially, if the information handling system is operated outside of the range it is designed for, device failures can occur and/or permanent physical damage to components of the information handling system can result.

SUMMARY

Embodiments of the present invention provide a method and system for heating and cooling an electronic device. The method and system includes independently heating or cooling separate zones within the electronic device. This can be done by selectively opening and closing a plurality of baffles and/or activating separate heating or cooling devices.

In accordance with the first aspect, the present invention provides a method for heating and cooling an electronic device. The method comprises of establishing at least two temperature zones in the electronic device and determining the temperature in each of the at least two temperature zones. The method then heats at least one of the at least two temperature zones if the temperature of the at least one of the at least two temperature zones is below a first threshold and/or cools at least one of the at least two temperature zones if the temperature of the at least one of the at least two temperature zones is above a second threshold.

In accordance with the second aspect, the present invention provides an electronic device comprising at least two temperature zones, at least one heating device, and at least one cooling device. The electronic device further comprises of a processor that controls the at least one heating device and the at least one cooling device, and a memory having computer program instructions stored thereon. The processor executes the computer program instructions in the memory to perform a method. The method comprises of determining the temperature in each of the at least two temperature zones. The method then causes the at least one heating device to heat at least one of the at least two temperature zones if the temperature of the at least one of the at least two temperature zones is below a first threshold. The method will also cause the at least one cooling device to cool at least one of the at least two temperature zones if the temperature of the at least one of the at least two temperature zones is above a second threshold.

In accordance with the third aspect, it provides a non-transitory computer readable medium comprising computer readable program code, which when executed by a computer processor enables the computer processor to perform a method. The method establishes at least two temperature zones in an electronic device and determines the temperature in each of the at least two temperature zones. The method then heats at least one of the at least two temperature zones, if the temperature of the at least one of the at least two temperature zones is below a first threshold. The method, alternatively, or additionally cools at least one of the at least two temperature zones, if the temperature of the at least one of the at least two temperature zones is above a second threshold.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

FIG. 1.1 shows a front view of a diagram of an information handling system in accordance with one or more embodiments of the invention.

FIG. 1.2 shows a side view of a diagram of an information handling system in accordance with one or more embodiments of the invention.

FIG. 3.1 shows a diagram of a chassis that includes open baffles in accordance with one or more embodiments of the invention.

FIG. 3.2 shows a diagram of a chassis that includes some baffles closed in accordance with one or more embodiments of the invention.

FIG. 3.3 shows a diagram of a chassis that includes front and back baffles that are all closed in accordance with one or more embodiments of the invention.

FIG. 4.1 shows a diagram of computing components having separate zones in accordance with one or more embodiments of the invention.

FIG. 4.2 shows a diagram of computing components with one zone having a heating element and another zone having a cooling system in accordance with one or more embodiment of the invention.

DETAILED DESCRIPTION

Figure 2:
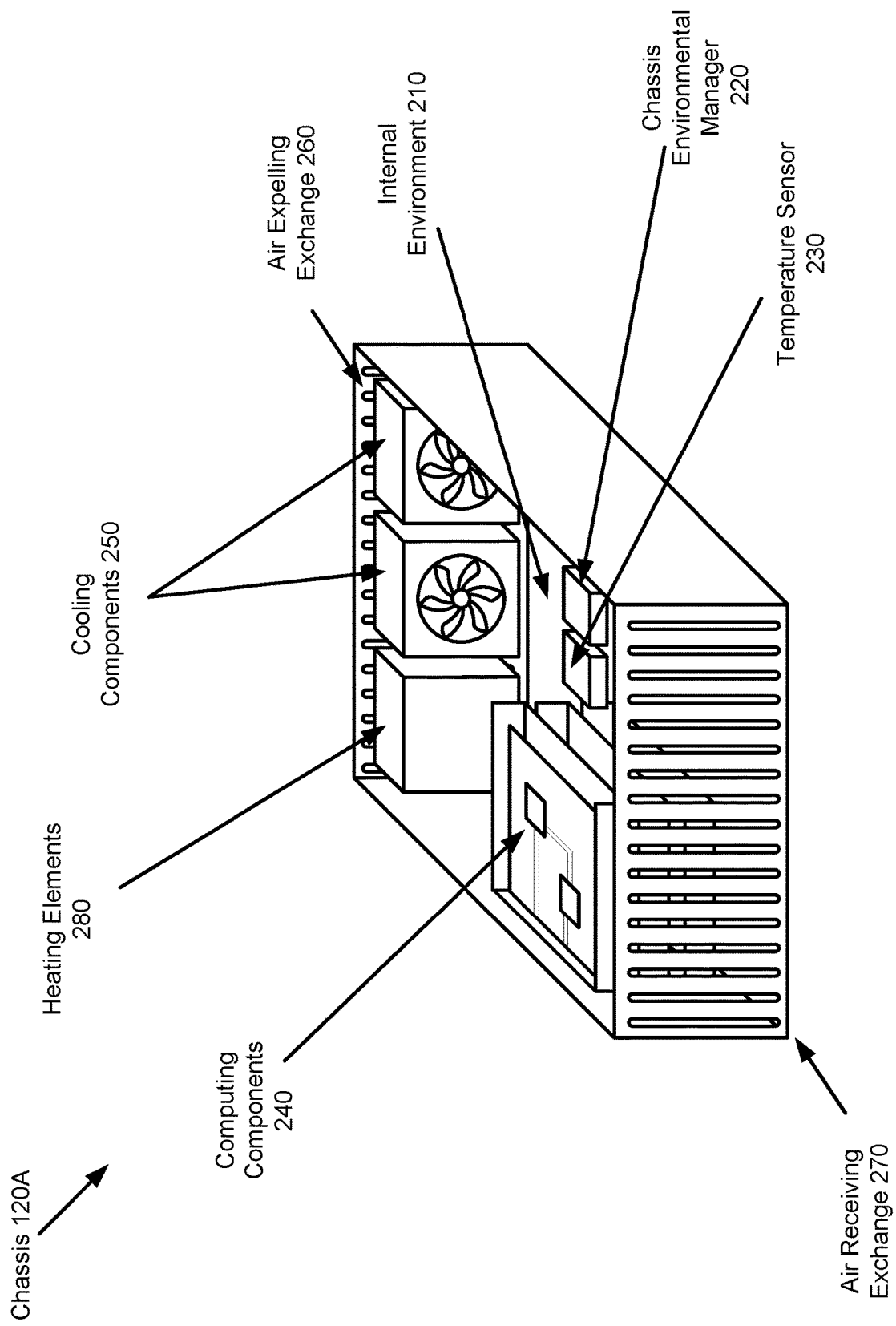
FIG. 2 shows a diagram of a chassis of an information handling systems in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regards to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to systems, devices, and methods for managing components of an electronic device. In at least one embodiment the electronic device is an information handling system that may provide computer implemented services. These services may include, for example, database services, electronic communication services, data storage services, etc.

To provide these services, the information handling system may include one or more computing devices. The computing devices may include any number of computing components that facilitate providing of the services of the information handling system. The computing components may include, for example, processors, memory modules, circuit cards that interconnect these components, etc.

During operation, these components may be exposed to external environmental/ambient air or gasses which may be at various temperatures including outside of a nominal (operational) temperature ranges specific to the components. When the temperature is outside of the nominal temperature ranges, without making adjustments or providing heating or cooling as appropriate, components of the information handling system can be damaged. Over time operating the components outside of the nominal temperature ranges may cause the components to fail prior to the computing devices meeting their expected service life.

Embodiments of the invention may provide methods and systems to actively monitor the internal temperatures associated with an electronic device and make corresponding changes to the operation of the various components making up the electronic devices. To determine when the internal temperatures are outside of preferred ranges, monitoring circuits will monitor the temperature inside the housing with at least one temperature sensor.

By determining internal temperatures associated with the electronic device(s), appropriate heating and cooling can be provided to each component of the electronic device. In at least some embodiments this can be achieved by selectively operating heating and cooling devices of the electronic device. In other embodiments this can be achieved by selectively opening and closing baffles in air intakes to control the path of cooling or heating air in the electronic device's housing. By doing so, system failure can be avoided and the components forming the electronic device may be less likely to prematurely fail, and the device may be able to operate in less than ideal environmental conditions while maintaining proper functioning of the electronic device.

FIG. 1.1 shows the front of an information handling system (100) in accordance with one or more embodiments of the invention and FIG. 1.2 shows a side view of an information handling system (100) in accordance with one or more embodiments of the invention. The system may include a frame (110) and any number of chassis (e.g., 120A, 120B, 120C).

The frame (110) may be a mechanical structure that enables multiple chassis (120A-120C) to be positioned with respect to one another. The mechanical structure of the frame (110) can include a door (150) that includes an air intake (140) for providing external ambient air to the chassis (120A) mounted within the frame (110).

The information handling system (100) can take many forms. For example, the frame (110) may be a rack mount enclosure that enables the chassis (120A) to be disposed within it.

The frame (110) may be implemented as other types of structures adapted to house, position, orient, and/or otherwise physically, mechanically, electrically, and/or thermally manage the chassis (120A-120C). By managing the chassis (120A), the frame (110) may enable multiple chassis (120A-120C) to be densely packed in space without negatively impacting the operation of the information handling system (100).

A chassis (e.g., 120A) may be a mechanical structure for housing components of an information handling system. For example, a chassis (120A) may be implemented as a rack mountable enclosure for housing components of an information handling system. The chassis may be adapted to be disposed within the frame (110) and/or utilize services provided by the frame (110) and/or other devices. Any number of components may be disposed in each of the respective chassis (e.g., 120A, 120B, 120C).

The system can also include an external power source (not shown). The external power source can take any forms and in one embodiment it is electrical power provided by an electrical utility. In other embodiments it may take the form of on-site power generators, including backup fossil-fuel burning generators, solar panels, wind energy, and other sources of power for operating computing components. The generating components of the external power source can be located near to the information handling system (100) or deliver power to the information handling system (100) over transmission means from off-site locations.

To maintain the temperatures of the components in the chassis, within a nominal range, an environmental manager (130) causes fans and other similar device to take in external airflow (160) though an air intake (140). The gases forming the external air may be passed to the chassis (120A) to cool or heat the components therein. The heated gases may then be expelled out of another opening (not shown) in the housing of the information handling system (100).

When the components of an information handling system provide computer implemented services, the components may generate heat. For example, the components may utilize electrical energy to perform computations and generate heat as a byproduct of performing the computations. If left unchecked, buildup of heat within a chassis may cause temperatures of the components disposed within the chassis to exceed preferred ranges.

The preferred ranges may include a nominal range in which the components respectively operate (i) without detriment and/or (ii) are likely to be able to continue to operate through a predetermined service life of a component. Consequently, it may be desirable to maintain the temperatures of the respective components within the preferred range (e.g., a nominal range).

When a component operates outside of the preferred (nominal) range, the service life of the component may be reduced. The component may not be able to perform optimally (e.g., reduced ability to provide computations, higher likelihood of error introduced into computations, etc.), and/or the component may be more likely to unexpectedly fail. The component may be subject to other undesirable behavior when operating outside of the preferred range without departing from the invention.

To operate components within the preferred range of temperatures, an environmental manager (130) along with other components such as the air intake (140) and air exchanges in the chassis (e.g. 165) may work to exchange gases such as air with an ambient environment. For example, a chassis (120A) may utilize air exchanges (165) to (i) vent hot air and (ii) intake cool air that is drawn in through the air intake (140). By doing so, the temperature of the air within the chassis may be reduced. Consequently, the temperatures of components within the chassis may be reduced by utilizing the cooler gases taken into the chassis via an air exchange.

In another example, the ambient gases and/or the internal environment of the information handling system (100) may be too cold. This can be detrimental to many of the components. For example below a certain temperature normal transistor operation of processors can be negatively affected. The environmental manager (130) or other similar devices can activate heating elements to heat the internal environment or individual components. In other embodiments the environmental manager (130) or other similar device can control fans and the air intakes (140) and (165) to reduce cooling and/or use waste heat to heat other components of the information handling system (100).

To address the above and/or other potential issues, electronic devices such as an information handling system (100) rely on heating and cooling systems to maintain the proper temperature. Yet in many telecom and edge applications (as non-limiting examples), heating and cooling systems are either not present, or are not sufficient for extreme weather. Also when external power is lost, it is possible that the heating and cooling systems (when present) will no-longer function, leading to any device powered by a back-up power system (not shown) to be subject to ambient temperatures.

To further clarify the processes of managing the internal temperature within an electronic device such as a chassis, a diagram of an exemplary chassis is illustrated in FIG. 2.

FIG. 2 shows a diagram of a chassis (120A) in accordance with one or more embodiments of the invention. A chassis (120A) may be a portion of an information handling system (100) and/or house all, or a portion, of an information handling system (see FIG. 1). An information handling system may include a computing device that provides any number of services (e.g., computing implemented services). To provide services, the computing device may utilize computing resources provided by the computing components (240). The computing components (240) may include, for example, processors, memory modules, storage devices, special purpose hardware, and/or other types of physical components that contribute to the operation of the computing device. For additional details regarding computing devices, refer to FIG. 8.

While the chassis (120A) of FIG. 2 has been illustrated as including a limited number of specific components, a chassis in accordance with one or more embodiments of the invention may include additional, fewer, and/or different components without departing from the invention. Additionally, while the chassis (120A) is illustrated as having a specific form factor (e.g., rack mount), a chassis in accordance with embodiments of the invention may have different form factors without departing from the invention, including as a device that can operate by itself with or without a frame (110).

As discussed above, the chassis (120A) may house computing components (240). The computing components (240) may enable computing devices to provide services, as discussed above. The computing components (240) may include, for example, packaged integrated circuits (e.g., chips). The computing components (240) may enable any number and type of functionalities to be performed by a computing device.

In one or more embodiments disclosed herein, the computing components (240) include storage that is implemented using devices that provide data storage services (e.g., storing data and providing copies of previously stored data). The devices that provide data storage services may include hardware devices and/or logical devices. For example, storage may include any quantity and/or combination of memory devices (i.e., volatile storage), long term storage devices (i.e., persistent storage), other types of hardware devices that may provide short term and/or long term data storage services, and/or logical storage devices (e.g., virtual persistent storage/virtual volatile storage).

For example, the computing components (240) may include a memory device (e.g., a dual in line memory device) in which data is stored and from which copies of previously stored data are provided. In another example, the computing components (240) may include a persistent storage device (e.g., a solid state disk drive) in which data is stored and from which copies of previously stored data are provided. In another example, computing components (240) may include (i) a memory device (e.g., a dual in line memory device) in which data is stored and from which copies of previously stored data are provided and (ii) a persistent storage device that stores a copy of the data stored in the memory device (e.g., to provide a copy of the data in the event that power loss or other issues with the memory device that may impact its ability to maintain the copy of the data cause the memory device to lose the data).

Computing components may consume electrical power and generate heat as a byproduct of performing their functionality. Further, the computing components (240) may have some sensitivity to temperature. For example, the computing components (240) may only operate nominally (e.g., as designed) when the temperatures of the respective components (240) are maintained within a preferred temperature range. Consequently, all, or a portion, of the computing components (240) may require some level of cooling and/or heating to continue to operate nominally.

Because the computing device uses computing components (240) to provide services, the ability of the computing device to provide services is limited based on the number and/or quantity of computing devices that may be disposed within the chassis. For example, by adding additional processors, memory modules, and/or special purpose hardware devices, the computing device may be provided with additional computing resources which it may be used to provide services. Consequently, large number of computing components that each, respectively, generate heat may be disposed within the chassis.

To maintain the temperatures of the computing components (240) (and/or other types of components) within a nominal range, external air such as ambient air may be taken in through an air receiving exchange (270). The gases forming the external air may be passed by the computing components (240) to exchange heat with them. The heated gases may then be expelled out of another air exchange such as an air expelling exchange (260).

The gases forming the external air are moved by cooling components (250). The cooling components (250) may include gas movers such as fans. The fans may be able to modify the rate of gases being taken into and expelled from the chassis (120A) through the air exchangers (e.g., 250). The cooling components (250) may also include baffles or dampeners, which will be described in more detail with regards to FIGS. 3.1-3.3. The rate of intake and exhaust of gases may cause an airflow to be generated within the internal environment (210). The airflow may be used to modify the rate of thermal exchange between the computing components (240) and the internal environment (210) (e.g., an environment proximate to the computing components (240)).

The gases and/or the computing components (240) can additionally be heated by the use of a heating element (280). While heating element (280) is shown as a stand-alone device mounted with other environmental cooling components (250), it can take many forms and can also comprise of multiple heating devices.

In at least one embodiment the heating element (280) can take the form of a heating device mounting over or under the surface of the computing components (240), such as a heater pad which has multiple individual heating elements. Each of the individual heating elements of the heater pad can be individually activated to selectively heat specific components/zones. Alternatively, all of the heating elements can be activated simultaneously. The heating element (280) may cover all of the computing components (240) or a select few of the computing components (240) that are more sensitive to cold. This will be described with more detail with regards to FIGS. 4.1 and 4.2.

In one embodiment, the heating element (280) is designed to heat the computing components (240) and/or other components of the chassis (120A) when the internal temperature is below a threshold. The internal temperature is determined by a temperature sensor (230). The temperature sensor (230) may take a variety of forms such as a thermocouple or other varieties of thermometers.

While shown as a single device in FIG. 2, the temperature sensor (230) can comprise of multiple temperature sensors that are mounted throughout the internal environment (210). In at least one embodiment, multiple temperature sensors (230) can be mounted with computing components (240) to give individual readings of the temperature with regards to certain components of the computing components (240).

Figure 5:
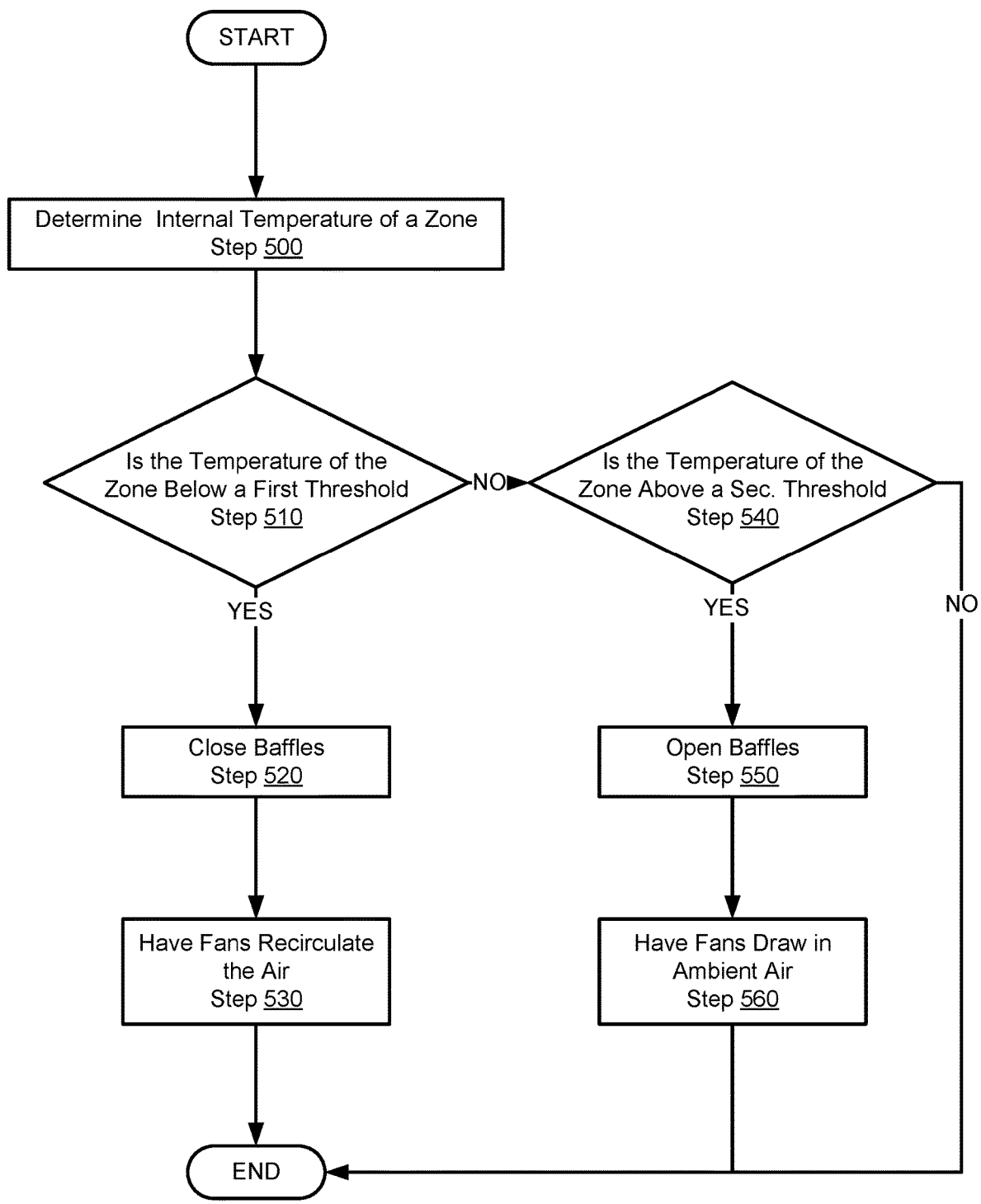
FIG. 5 shows a flowchart of a method for heating or cooling a zone of the system by opening or closing specific baffles in accordance with one or more embodiments of the invention.
Figure 6:
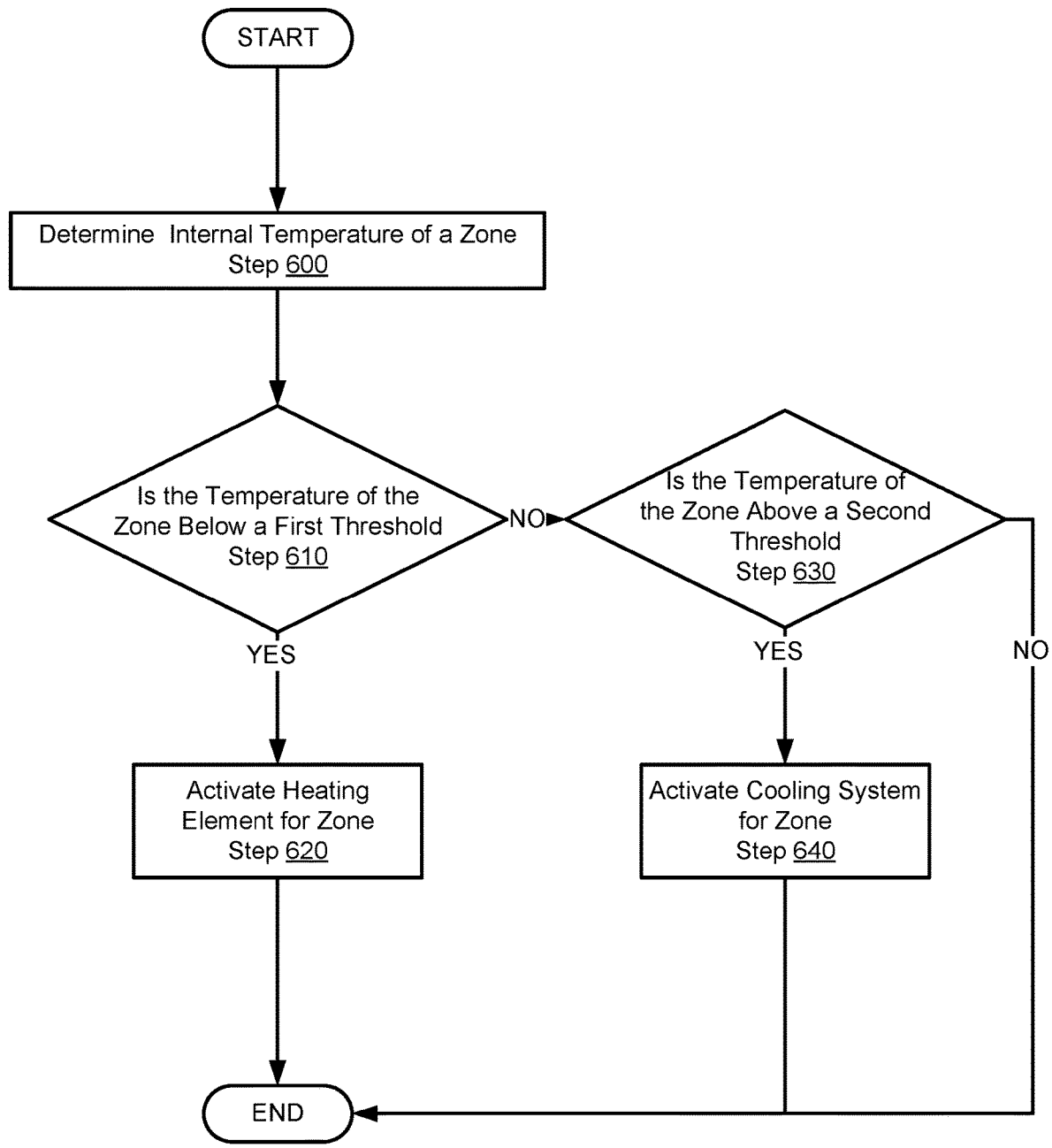
FIG. 6 shows a flowchart of a method for heating or cooling a zone of the system by activating a heating element or a cooling system in accordance with one or more embodiments of the invention.
Figure 7:
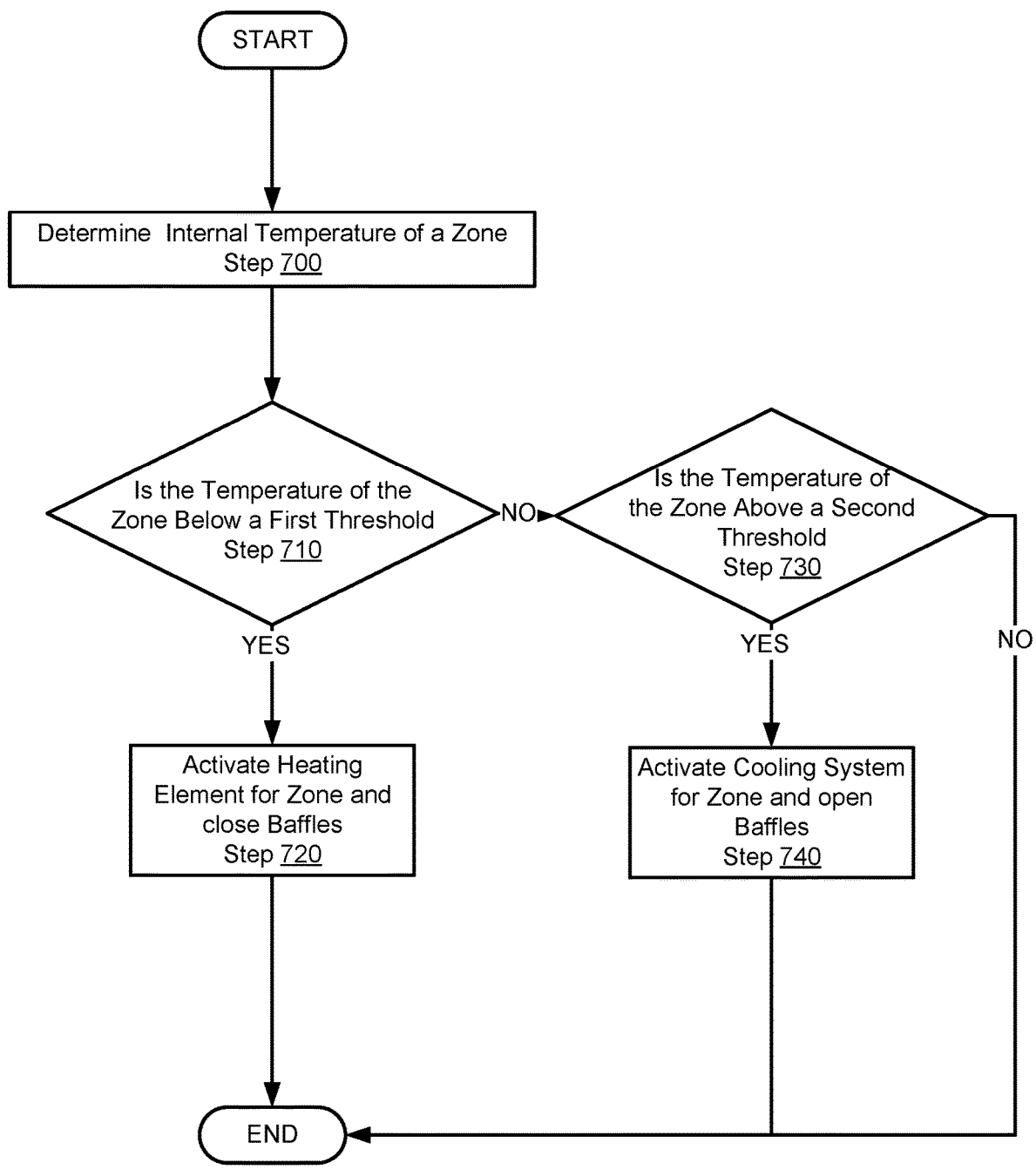
FIG. 7 shows a flowchart of a method for heating or cooling a zone of the system by both opening and closing specific baffles as well as using a heating element or cooling system.

A chassis environmental manager (220) can be provided which analysis the internal temperature of the internal environment (210) and/or ambient temperatures outside of the chassis (120A) and/or information handling system (100) to perform the methods described in more detail with regards to FIGS. 5-7. The chassis environmental manager (220) may control the cooling components (250), heating elements (280) and may also control the power delivered to individual computing components (240) in order to insure a safe powering-up.

The chassis environmental manager (220) may be implemented using, for example, a digital signal processor, a field programmable gate array, or an application specific integrated circuit. The chassis environmental manager (220) may comprises of a processor and memory that can operate outside of the range of temperatures that other computing components (240) can safely operate. The chassis environmental manager (220) may be implemented using other types of hardware devices without departing from the invention.

In one or more embodiments of the invention, the chassis environmental manager (220) is implemented using computing code stored on a persistent storage that when executed by a processor performs all, or a portion, of the functionality of the chassis environmental manager (220). The processor may be a hardware processor including circuitry such as, for example, a central processing unit or a microcontroller. The processor may be other types of hardware devices for processing digital information without departing from the invention.

The chassis environmental manager (220) and/or computing components (240) may include one or more data structures that include information regarding the environmental conditions within the internal environment (210) of the chassis (120A). For example, when temperature data is read from the temperature sensor (230), the read information may be stored in an environmental condition repository. Consequently, a historical record of the environmental conditions in the internal environment (210) may be maintained. The historical record of the environmental conditions may include any type and quantity of information regarding the environmental conditions within the repository. For example, an environmental condition repository may include temperature sensor data from discrete temperature sensors and/or temperature sensors integrated into computing components (and/or other types of devices). In another example, the environmental condition repository or any equivalent repository, may include a table of the power level in the form of electrical currents, needed to provide a specific airflow rate as well as changes over time in those currents. The tables may also include initial factory installed temperature thresholds which determine when it's safe to power on the system or individual components, as well as temperature threshold for preheating, or determining that it is not safe to power on any components.

While the data structures have been described as including a limited amount of specific information, any of the data structures stored in storage may include additional, less, and/or different information without departing from the embodiments disclosed herein. Further, the aforementioned data structures may be combined, subdivided into any number of data structures, may be stored in other locations (e.g., in a storage hosted by another device), and/or spanned across any number of devices without departing from the embodiments disclosed herein. Any of these data structures may be implemented using, for example, lists, tables, linked lists, databases, or any other type of data structures usable for storage of the aforementioned information.

Alternatively, or additionally, the chassis environmental manager (220) can be part of other components mounted in the chassis (120A), such as the cooling components (250), heating element (280) or computing components (240). The chassis environmental manager, as well as other environmental control components, can also include or comprise of components (not shown) that are not disposed in the chassis (120A). For example, the environmental control components may include an airflow conditioner. These external components may be used in conjunction with the environment control components disposed within the chassis to manage the temperature and/or relative humidity levels throughout the internal environment (220) of the chassis (120A).

The chassis (120A) may include any number and type of environmental control components without departing from the invention. Any of the environmental control components may be implemented using physical devices operably connected to and/or controllable by the chassis environmental manager (220) and/or a system environmental managers (130) that is part of the larger information handling system (alone or in combination). Any number of chassis environmental managers (220) and system environmental managers (130) may cooperatively operate to manage the thermal load generated by the computing components (240) and/or other components.

The cooling components (250), heating element (280), and other environmental control components may be physical devices that are able to, at a granular level, modify characteristics of the environment of a set of one or more computing components (240) without affecting the environment of other computing components (240) outside of the set. The environmental control components (250) may be modified in response to a change in the environment to enable, or disable, airflow to pass through the set of computing components associated with a specific airflow component. The airflow may be an airflow provided by an airflow component (e.g., a fan forming part of the environmental control components 250) in the chassis (120A). In enabling, or disabling, the airflow, the temperature of the ambient environment of the set of computing components (210) may be increased or decreased, which may result in a reduction in the rate of change of contamination on the set of computing components while maintaining the nominal range of temperatures that is preferred for operability in the set of computing components.

While the chassis environmental manager (220), temperature sensor (230), cooling components (250) and heating elements (280) of FIG. 2 have been described and illustrated as including a limited number of specific components for the sake of brevity, these components in accordance with embodiments of the invention may include additional, fewer, and/or different components than those illustrated in FIG. 2 without departing from the invention.

While the chassis (120A) has also been illustrated as including a limited number of specific components, a chassis in accordance with one or more embodiments of the invention may include additional, fewer, and/or different components without departing from the invention. Additionally, while the chassis (120A) is illustrated as having a specific form factor (e.g., rack mount), a chassis in accordance with embodiments of the invention may have different form factors without departing from the invention including as a device that can operate by itself with or without a frame (110).

As discussed above, the chassis (120A) may house computing components (not shown). The computing components may enable computing devices to provide services, as discussed above. The computing components may include, for example, packaged integrated circuits (e.g., chips). The computing components may enable any number and type of functionalities to be performed by a computing device.

In one or more embodiments disclosed herein, the computing components in the chassis (120A) include storage that is implemented using devices that provide data storage services (e.g., storing data and providing copies of previously stored data). The devices that provide data storage services may include hardware devices and/or logical devices. For example, storage may include any quantity and/or combination of memory devices (i.e., volatile storage), long term storage devices (i.e., persistent storage), other types of hardware devices that may provide short term and/or long term data storage services, and/or logical storage devices (e.g., virtual persistent storage/virtual volatile storage).

For example, the computing components in the chassis (120A) may include a memory device (e.g., a dual in line memory device) in which data is stored and from which copies of previously stored data are provided. In another example, the computing components may include a persistent storage device (e.g., a solid state disk drive) in which data is stored and from which copies of previously stored data are provided. In another example, computing components may include (i) a memory device (e.g., a dual in line memory device) in which data is stored and from which copies of previously stored data are provided and (ii) a persistent storage device that stores a copy of the data stored in the memory device (e.g., to provide a copy of the data in the event that power loss or other issues with the memory device that may impact its ability to maintain the copy of the data cause the memory device to lose the data).

Computing components may consume electrical power and generate heat as a byproduct of performing their functionality. Further, the computing components may have some sensitivity to temperature. For example, the computing components may only operate nominally (e.g., as designed) when the temperatures of the respective components are maintained within a preferred temperature range. Consequently, all, or a portion, of the computing components may require some level of cooling and/or heating to continue to operate nominally.

Because the information handling system (100) uses computing components to provide services, the ability of the information handling system (100) to provide services is limited based on the number and/or quantity of computing devices that may be disposed within the chassis. For example, by adding additional processors, memory modules, and/or special purpose hardware devices, the computing device may be provided with additional computing resources which it may use to provide services. Consequently, a large number of computing components that each, respectively, generate heat may be disposed within the chassis.

To further clarify embodiments of the invention, a non-limiting example is provided in FIGS. 3.1-3.3 of a chassis (120A) which utilizes baffles, to at least in part, control heating and cooling of the components mounted in the chassis (120A). FIGS. 3.1-3.3 illustrate top view diagrams of a chassis (120A) of an information handling system (100) with different configurations of front (330), internal (336) and rear baffles (334). For the sake of brevity, only a limited number of components of the system of FIGS. 1.1 and 1.2 as well as the chassis of FIG. 2 are illustrated in each of FIGS. 3.1-3.3.

FIG. 3.1 illustrates a chassis (120A) of an information handling system that houses a set of computing components (240). The computing components (240) may include, for example, a processor (312) and memory modules (314). The computing components (240) may be mounted on a circuit card, heat sink, or other structure that provides support, traces/wiring, and power to the processor, memory modules, and any other components.

To provide their functionalities, the processor (312) and the memory modules (314) may each consume electricity and produce heat as a byproduct during operation. Consequently, if left unchecked, the heat produced by these components may increase the temperatures of these components outside of their nominal operating ranges. Alternatively, if the temperature becomes too low, such as during a power loss, the components may not function correctly or incur damage due to operating outside of a nominal operating range.

To manage the temperatures of these components, the chassis (120A) may include cooling components (320). The cooling components in one non-limiting example can comprise of fans. Other types of air movers or cooling systems (including liquid cooling and Peltier cooling) are conceived of and can be used instead of or in addition to the fans.

The cooling components (320) may be fans with an adjustable rotation rate that enables them to produce airflows (e.g., 355A-355N) of variable-rate. In addition, various set of baffles (330, 336, and 334) can be provided to adjust the direction and flow rate of the airflows (e.g., 355A-355N). While only three sets of baffles are shown, more or less sets of baffles can be used.

The operation of the cooling components (320) and baffles (330, 336, and 334) may be controlled by an environmental manager (not shown in FIGS. 3.1-3.3) such as that shown in FIG. 1.2 (e.g. 130) or a shown in FIG. 2 (e.g. 220). Alternatively, the cooling components (320) and baffles (330, 336, and 334) can be controlled by controllers/processor that are part of each device. Further, the environmental manager may be implemented using, for example, a digital signal processor, a field programmable gate array, or an application specific integrated circuit. The environmental manager may comprise of a processor and memory that can operate outside of the range of temperatures that other computing components (240) can safely operate. The chassis environmental manager may be implemented using other types of hardware devices without departing from the invention.

In one or more embodiments of the invention, the environmental manager is implemented using computing code stored on a persistent storage that when executed by a processor performs all, or a portion, of the functionality of the environmental manager. The processor may be a hardware processor including circuitry such as, for example, a central processing unit or a microcontroller. The processor may be other types of hardware devices for processing digital information without departing from the invention.

The environmental manager receives temperature data from various temperature sensors (340A-340N), which are placed throughout the chassis 120A, including in the vicinity of specific computing components (e.g. temperature sensor 340A), and elsewhere in the internal environment of the Chassis (120A). More or less temperature sensors (340N) can be used depending on specific needs to allow the environmental manager to understand the environmental conditions within the chassis (120A). Other types of sensors such as air speed sensors (not shown) may be included as needed.

Sensors such as the temperature sensors (340A-340N) can be placed in the vicinity of specific components that have different heating requirements. For example temperature sensor A (340A) is placed near the memory (314) while an additional temperature sensor N (340N) is positioned near the processor (312). Various areas of the chassis (120A) can be divided up into separate heating and/or cooling zones, as will be described in more detail with FIGS. 4.1 and 4.2.

As shown in FIG. 3.1, the environmental manager, causes cooling components (320) to produce airflows (355A-355N). The cooling components draw in air from an air source (350) through front baffles (330) and expels the airflow (355) out of the chassis through rear-baffles (344). The air source (350) can comprise of ambient air from outside the information handling system (100) that is drawn in through the air intake (140) and air exchanges (165). Alternatively, the air source (350) can be cooling/heating air provided by an HVAC system of the facility the information handling system is mounted within. Other sources of the air besides these just listed could also be used.

The airflow (355) can be visualized as a series of airflow (355A-355N) which cool (or heat) sub portions of the chassis (120A) and devices within. In reality the various air masses making up the airflows (355) mix and diffuse into each other and the individual series of airflows (355A-355N) are only shown to increase understanding of the heating and cooling of the chassis (120A) as well as the effects of the controlling of the cooling components and baffles (330, 336, and 334).

For example, airflow A (355A), indicates an air mass that traverses proximate to the memory modules (314), reduces the temperature of the memory modules to a nominal range. Another airflow (355N), indicates an air mass that traverses proximate to the processor (312) and reduces the temperature of the processor to another nominal range.

These air masses/airflows (355A-355N) can be additionally controlled by front baffles (330) and rear baffles (334). Optional internal baffles such as the internal baffles (336) shown in FIG. 3.1 can also be provided and can be located in any position in the chassis (120A) where additional control of the directions and speed of the airflows (355A-355N) is needed.

A first front baffle (330A) may be positioned to control the airflow proximate to the memory modules (314), while additional front baffles (330) and rear baffles (334) control the airflow proximate to other components. By separately operating the baffles and cooling components, separate zones of heating and/or cooling can be established within the chassis (120A) as shown in more detail with FIGS. 3.2 and 3.3.

For example, FIG. 3.2 shows a situation where a first front baffle A (330A) is in a closed state. As shown, this blocks airflow A (355A) which in FIG. 3.1 cooled the memory (314). By blocking this airflow (355A), the baffles allow the memory (314) to heat, while airflow (355N) continues to cool other components such as the processor (312). If at a later time the environmental manager determines that the temperature measurements from temperature sensors (340) in the vicinity of the memory (314) is too high, the environmental manager can cause front baffle A (330A) to open letting cooling air to resume cooling the memory (314) as shown in the configuration of FIG. 3.2.

Another example is shown in FIG. 3.3. In FIG. 3.3 both the front baffles (330) and rear baffles (334) are closed. If the cooling components (320) continue to operate, the air is then recirculated in the chassis (120A) as recirculating airflow (355). By operating the baffles (330 and 334) and cooling components (320) in this configuration, the waste heat from the various components in the chassis (120A) can be captured by the recirculating airflow (355) and used to increase the temperature within the chassis (120A) with or without the use of additional heating elements.

Various combinations of open and closed baffles (330) as well as operations of the cooling components can be configured as appropriate by the environmental manager. The method of controlling the baffles and cooling components (320) to heat or cool individual zones or areas of the chassis (120A) is described in more detail in FIG. 5. In other embodiments, additional cooling and heating means can be used alongside the baffles to heat or cool individual zones as described in more detail in FIG. 7.

To further clarify embodiments of the invention, a non-limiting example of the heating and cooling zones, is provided in FIGS. 4.1 and 4.2. FIGS. 4.1 and 4.2 illustrate top view diagrams of the computing components (240) separated into at least two zones: zone A (420) and zone B (430). For the sake of brevity, only a limited number of components of the system of FIG. 2 are illustrated in each of FIGS. 4.1 and 4.2.

FIG. 4.1 shows the computing components (240) of an electronic device such as the chassis (120A) of the information handling system (100). The computing components (240) can include heat generating components such as a processor (460) and memory (450) which are connected to each other. Other components as needed can be included in the computing components (240) as well, such as traces, other processors, and other storage means. The components can be mounted on one or more cards, printed circuit boards (PCBs) or other structures such as heat sinks (not shown). A plurality of temperature sensors (440A and 440B) can also be provided.

The computing components can be divided into separate heating zones. FIG. 4.1 shows a non-limiting example where there are two zones (420 and 430), however more zones can be used. Alternatively, the computing components (240) can reside in only one zone, while other components of the chassis (120A) can be considered one or more different zones. The zones (420 and 430) are chosen so that different components, which have different heating and/or cooling needs, can be separately heated and/or cooled as shown in more detail in FIG. 4.2. In yet another alternative embodiment, each zone can be separately heated at different levels and/or temperatures; however, when cooling is needed the entire chassis is uniformly cooled without considering the specific zones. Other alternatives to heating and/or cooling each zone or the entire chassis (120A) are possible and anticipated by this invention. Those skilled in the art will appreciate that not all computing components need to be associated with a zone; rather, only a subset of the computing components may be associated with a zone(s) without departing from the invention.

Either zone (420 or 430) can be heated and/or cooled based on the temperature detected by the temperature sensors (440A and 440B). If the temperature in zone A (420) is determined to be higher than a second threshold, then that zone can be cooled. If the temperature in the zone (420) is found to be lower than a first threshold, it can be heated. Each zone can have different first and/or second thresholds. This can be repeated for each zone and as shown in FIG. 4.1 it is possible that one zone (420) can be cooled while an additional zone (430) is heated. In another example zone A (420) can be heated at a first level, while zone B (430) can be simultaneously heated at a second level, by altering the heating elements (470) in each zone to produce a desired amount of heating. Other combinations and number of zones are possible and anticipated by this invention.

FIG. 4.2 shows a non-limiting Example where the first zone, zone A (420) is cooled in at least one embodiment by cooling air (480). The second zone B (430) is heated by a heating element (470) while the first zone A (420) is being cooled.

While FIG. 4.2 shows the first zone A (420) being cooled by cooling Air (480), alternatively, or additionally it could be cooled by a cooling element that is specific to that zone and could comprise such devices as a thermoelectric coolers, a Peltier cooler, liquid cooler, or other cooling means that can be zone specific. In yet another alternative it could be selectively cooled by selectively using baffles and cooling components as described with regards to FIGS. 3.1-3.3 and by the method described in FIGS. 5-7.

Similarly, FIG. 4.2 shows a non-limiting example where zone B (430) is being heated. As shown in FIG. 4.2 the zone is heated using a heating element (470). Heating element could take many forms, including resistive heating built into the substrate that the processor and other components are mounted on. Other heating means could be a thermal blanket, a heater pad with individual heating elements, heated liquid, or other heating means that can be zone specific. In yet another alternative it could be selectively heated by the selective use of baffle as described with regards to FIGS. 3.1-3.3 and by the method described in FIGS. 5-7.

While FIG. 4.2 shows an example where zone A (420) is cooled and zone B (430) is heated. Both zones could be heated or both zones could be cooled depending on the specific temperature in the zone and the requirements of components specific to those zones.

While the electronic device such as the information handling system (100) and chassis (120A) has been illustrated in FIGS. 1.1, 1.2, 2, 3.1-3.3, 4.1, and 4.2 as including specific numbers and types of components, an electronic device in accordance with embodiments of the invention may include different, fewer, and/or additional components without departing from the invention.

FIGS. 5-7 show a flowchart of methods in accordance with one or more embodiments of the invention.

The method depicted in FIG. 5 may be used to control the baffles (330 and 334) and cooling components (320) to maintain a temperature within a desired range which includes a first threshold and a second threshold which are the lower and upper bounds of the range. The method shown in FIG. 5 may be performed by, for example, by the chassis environmental manager (e.g., 220, FIG. 2). Alternatively, this can be performed by the device's BIOS. Other components of the system illustrated in FIGS. 1.1, 1.2, 2, and 3.1-3.3. may perform all, or a portion, of the method of FIG. 3 without departing from the invention.

While FIG. 5 is illustrated as a series of steps, any of the steps may be omitted, performed in a different order, additional steps may be included, and/or any or all of the steps may be performed in a parallel and/or partially overlapping manner without departing from the invention.

In step 500, the system determines the temperature of a zone. This can be done with a temperature sensor (440), which is specific to the zone (e.g. 440A in 420). The temperature sensor (440), which can take a variety of forms such as a thermocouple or a thermometer. The temperature sensor (440) can be mounted as shown in FIG. 4.1 on a substrate holding computing components (240), and be mounted within the zone (420). Alternatively, the temperature sensor (440) can be mounted anywhere in the housing of the electronic device where it can accurately obtain the temperature of the zone (420). While a single temperature sensor (440) is shown in each zone of FIG. 4.1, the temperature of each zone could be determined by finding the average temperature or lowest temperature of a plurality of temperature sensors disposed in various location associated with the device and/or electronic device. The internal temperature can also be the lowest temperature detected over a specific period or may be a historical lowest temperature for a particular time stored in the memory of the electronic device.

In step 510, a processor determines if the internal temperature of the zone from step 500 is below a first threshold. The first threshold can be component specific, for example if a processor needs to be at least at 20° C. to safely operate, the threshold may be set at 20° C. Other threshold temperatures can be chosen based on what the specific devices in a zone require. In general the threshold is provided by the manufacturer or by an end user of the electronic device and the threshold can be determined based on the specific electronic device(s) and capabilities of heating elements and cooling elements.

If the internal temperature is determined to be below the first threshold, the method proceeds to step 520. Otherwise (when the internal temperature is above the first threshold), the method proceeds to step 540.

In step 520, the method selectively closes the baffles (330 and 334) as shown in FIGS. 3.2 and 3.3. This may comprise of only closing baffles which control air flow into a specific zone as shown in FIG. 3.2, where baffle 330A is closed, blocking the corresponding airflow A 355A. Alternatively, as shown in FIG. 3.3 both the external and front baffles (330 and 334) may be closed.

In step 530, the air inside of the zone or in the entire internal environment (210) is caused to recirculate by fans making up the cooling components (320). The cooling components (320) can take various forms and may not necessarily be fans; the only requirement is that the cooling components (320) can move and recirculate the internal airflows (355). Additionally, optional internal baffles (336) can also be used to direct heated air to the appropriate zones. Recirculated air then heats the internal environment by capturing waste heat from the various computing components (240) and other components including the cooling components (250), optional heating elements (280) and chassis environmental manager (220). This is continued until the temperature of the zone is above the first threshold.

Returning to step 510, if the temperature is above the first threshold, the method proceeds to step 540. In step 540, the processor determines if the internal temperature of the zone as determined in step 500 is above a second threshold. If it is not above the second threshold (i.e. it is in the ideal range for the components in the zone), the method of FIG. 5 ends. Otherwise if the temperature is above the second threshold, the method proceeds to step 550.

The second threshold can also be component specific, for example if a processor needs to have a temperature below 35° C. to properly operate, the threshold may be set at 35° C. Other threshold temperatures can be chosen based on what the specific devices in a zone require. In general the threshold is provided by the manufacturer or by an end user of the electronic device and the threshold can be determined based on the specific electronic device(s) and capabilities of heating elements and cooling elements.

In step 550, the method opens the baffles (330 and 334) as shown in FIGS. 3.1 and 3.2. This may comprise of only open baffles which control air flow into a specific zone as shown in FIG. 3.2, where a first baffle (330A) is closed while all other baffles (330N) are opened allowing airflow (355N) from air source (350) to cool the zones it passes over while other zones continue to heat or at least not be cooled. Alternatively, as shown in FIG. 3.1 both the external and front baffles (330 and 334) may be open.

In step 560, the air inside of the zone or in the entire internal environment (210) is circulated by fans making up the cooling components (320). The cooling components (320) can take various forms and may not necessarily be fans; the only requirement is that the cooling components (320) can move and circulate the external air from air source (350). The circulated airflow (355N) captures waste heat from the various computing components (240) and other components including the cooling components (250), optional heating elements (280) and chassis environmental manager (220) and passes them to the external ambient environment through the air expelling exchange (260). This is continued until the temperature of the zone is below the second threshold.

The method of FIG. 5 may end following one of steps 530, 540, or 560 as appropriate. The method of FIG. 5 may be repeated for each of the plurality of zones (e.g. zone B (430) in FIG. 4.1). The method may also be repeated for the specific zone, periodically on a set schedule (either as set by a manufacture or an end user), or it can be continuously performed to insure that the temperature of the zone does not deviate out of the ideal range of the components in the zone.

The method depicted in FIG. 6 may be used to control specific heating elements (470) in a zone and cooling elements, such as cooling air (480) for a specific zone (420 and 430 for example) to maintain a temperature within a desired range which includes a first threshold and a second threshold which are the lower and upper bounds of the range. The method shown in FIG. 6 may be performed by, for example, by the chassis environmental manager (e.g., 220, FIG. 2). Alternatively, this can be performed by the device's BIOS. Other components of the system illustrated in FIGS. 1.1, 1.2, 2, 4.1, and 4.2. may perform all, or a portion, of the method of FIG. 6 without departing from the invention.

While FIG. 6 is illustrated as a series of steps, any of the steps may be omitted, performed in a different order, additional steps may be included, and/or any or all of the steps may be performed in a parallel and/or partially overlapping manner without departing from the invention.

In step 600, the system determines the temperature of a zone. This can be done with a temperature sensor (440), which is specific to the zone (e.g. 440A in 420). The temperature sensor (440) which can take a variety of forms such as a thermocouple or a thermometer. The temperature sensor (440) can be mounted as shown in FIG. 4.1 on circuit card holding computing components (240), and be mounted within the zone (420). Alternatively, the temperature sensor (440) can be mounted anywhere in the housing of the electronic device where it can accurately obtain the temperature of the zone (420). While a single temperature sensor (440) is shown in each zone of FIG. 4.1, the temperature of each zone could be determined by finding the average temperature or lowest temperature of a plurality of temperature sensors disposed in various location associated with the device and/or electronic device. The internal temperature can also be the lowest temperature detected over a specific period or may be a historical lowest temperature for a particular time stored in the memory of the electronic device.

In step 610, a processor determines if the internal temperature of the zone from step 600 is below a first threshold. The first threshold can be component specific, for example if a processor needs to be at least at 20° C. to safely operate, the threshold may be set at 20° C. Other threshold temperatures can be chosen based on what the specific devices in a zone require. In general the threshold is provided by the manufacturer or by an end user of the electronic device and the threshold can be determined based on the specific electronic device(s) and capabilities of heating elements and cooling elements.

If the internal temperature is determined to be below the first threshold, the method proceeds to step 620. Otherwise (when the internal temperature is above the first threshold), the method proceeds to step 630.

In step 620, the method activates heating elements (470) associated with the specific zone (430) as shown in FIG. 4.2. This may comprise of heating just one zone (430) as shown in FIG. 4.2 or it can comprise one heating more than one or all of the zones. While shown in FIG. 4.2 the heating element (470) is specific to each zone, a common heating element (280) can be used along with appropriate means for directing the heat to the required zone (for example as will be described in the method of FIG. 7). This is continued until the temperature of the zone is above the first threshold.

Returning to step 610, if the temperature is above the first threshold, the method proceeds to step 630. In step 630, the processor determines if the internal temperature of the zone as determined in step 600 is above a second threshold. If it is not above the second threshold (i.e. it is in the ideal range for the components in the zone), the method of FIG. 6 ends. Otherwise if the temperature is above the second threshold, the method proceeds to step 640.

The second threshold can also be component specific, for example if a processor needs to have a temperature below 35° C. to properly operate, the threshold may be set at 35° C. Other threshold temperatures can be chosen based on what the specific devices in a zone require. In general the threshold is provided by the manufacturer or by an end user of the electronic device and the threshold can be determined based on the specific electronic device(s) and capabilities of heating elements and cooling elements.

In step 640, the method activates a cooling system such as circulating cooling air (480) over the components in the zone (420) as shown in FIGS. 4.2. This may comprise of directing cooling air (480) by fans or other air moving devices from the cooling components. Alternatively, individual cooling elements may be provided for each zone. The cooling elements can take many forms such as recirculating cooling liquids, thermoelectric cooling such as a Peltier cooler, and any other device that can provide appropriate cooling to the components in a particular zone that needs to be cooled. This may comprise of only cooling a specific zone (420) as shown in FIG. 4.2. Alternatively, common cooling components (250) can be used to cool the zone or the entire internal environment (210). This is continued until the temperature of the zone is below the second threshold.

The method of FIG. 6 may end following one of steps 620, 630, or 640 as appropriate. The method of FIG. 6 may be repeated for each of the plurality of zones (e.g. zone B (430) in FIG. 4.1). The method may also be repeated for the specific zone, periodically on a set schedule (either as set by a manufacturer or an end user), or it can be continuously performed to ensure that the temperature of the zone does not deviate out of the ideal range of the components in the zone.

The method depicted in FIG. 7 may be used to control both specific heating elements (470) and baffles (330, 334, and 336) in a zone and cooling components (250) and baffles (330, 334, and 336), for a specific zone (420 and 430 for example) to maintain a temperature within a desired range which includes a first threshold and a second threshold which are the lower and upper bounds of the range. The method shown in FIG. 7 may be performed by, for example, the chassis environmental manager (e.g., 220, FIG. 2). Alternatively, this can be performed by the device's BIOS. Other components of the system illustrated in FIGS. 1.1, 1.2, 2, 3.1-3.3, 4.1, and 4.2. may perform all, or a portion, of the method of FIG. 6 without departing from the invention.

While FIG. 7 is illustrated as a series of steps, any of the steps may be omitted, performed in a different order, additional steps may be included, and/or any or all of the steps may be performed in a parallel and/or partially overlapping manner without departing from the invention.

In step 700, the system determines the temperature of a zone. This can be done with a temperature sensor (440), which is specific to the zone (e.g. 440A in 420). The temperature sensor (440) can take a variety of forms such as a thermocouple or a thermometer. The temperature sensor (440) can be mounted as shown in FIG. 4.1 on a substrate holding computing components (240), and be mounted within the zone (420). Alternatively, the temperature sensor (440) can be mounted anywhere in the housing of the electronic device where it can accurately obtain the temperature of the zone (420). While a single temperature sensor (440) is shown in each zone of FIG. 4.1, the temperature of each zone could be determined by finding the average temperature or lowest temperature of a plurality of temperature sensors disposed in various location associated with the device and/or electronic device. The internal temperature can also be the lowest temperature detected over a specific period or may be a historical lowest temperature for a particular time stored in the memory of the electronic device.

In step 710, a processor determines if the internal temperature of the zone from step 700 is below a first threshold. The first threshold can be component specific, for example if a processor needs to be at least at 20° C. to safely operate, the threshold may be set at 20° C. Other threshold temperatures can be chosen based on what the specific devices in a zone require. In general the threshold is provided by the manufacturer or by an end user of the electronic device and the threshold can be determined based on the specific electronic device(s) and capabilities of heating elements and cooling elements.

If the internal temperature is determined to be below the first threshold, the method proceeds to step 720. Otherwise (when the internal temperature is above the first threshold), the method proceeds to step 730.

In step 720, the method activates heating elements (470) and selectively closes baffles (330 and 334) associated with the specific zone (430) as shown in FIGS. 3.2, 3.3, and 4.2. This may comprise of heating just one zone (430) as shown in FIGS. 3.2 and 4.2 or it can comprise heating more than one or all of the zones. While shown in FIG. 4.2 the heating element (470) is specific to each zone, a common heating element (280) can be used along with selectively closing or opening baffles (330, 334, and 336) for directing the heat to required zone. This is continued until the temperature of the zone is above the first threshold.

Returning to step 710, if the temperature is above the first threshold, the method proceeds to step 730. In step 730, the processor determines if the internal temperature of the zone as determined in step 700 is above a second threshold. If it is not above the second threshold (i.e. it is in the ideal range for the components in the zone), the method of FIG. 7 ends. Otherwise if the temperature is above the second threshold, the method proceeds to step 740.

In step 740, the method activates a cooling system such as circulating cooling air (480) over the components in the zone (420) as shown in FIGS. 4.2. This may comprise of selectively opening or closing baffles (330, 334, and 336) to direct cooling air (480) by fans or other air moving devices from the cooling components. Alternatively, or additionally, individual cooling elements may be provided for each zone. The cooling elements can take many forms such as recirculating cooling liquids, thermoelectric cooling such as a Peltier cooler, and any other device that can provide appropriate cooling to the components in a particular zone that needs to be cooled. This may comprise of only cooling a specific zone (420) as shown in FIG. 4.2. Alternatively, common cooling components (250) can be used to cool the zone or the entire internal environment (210). This is continued until the temperature of the zone is below the second threshold.

The method of FIG. 7 may end following one of steps 720, 730, or 740 as appropriate. The method of FIG. 7 may be repeated for each of the plurality of zones (e.g. zone B (430) in FIG. 4.1). The method may also be repeated for the specific zone, periodically on a set schedule (either as set by a manufacture or an end user), or it can be continuously performed to insure that the temperature of the zone does not deviate out of the ideal range of the components in the zone.

Figure 8:
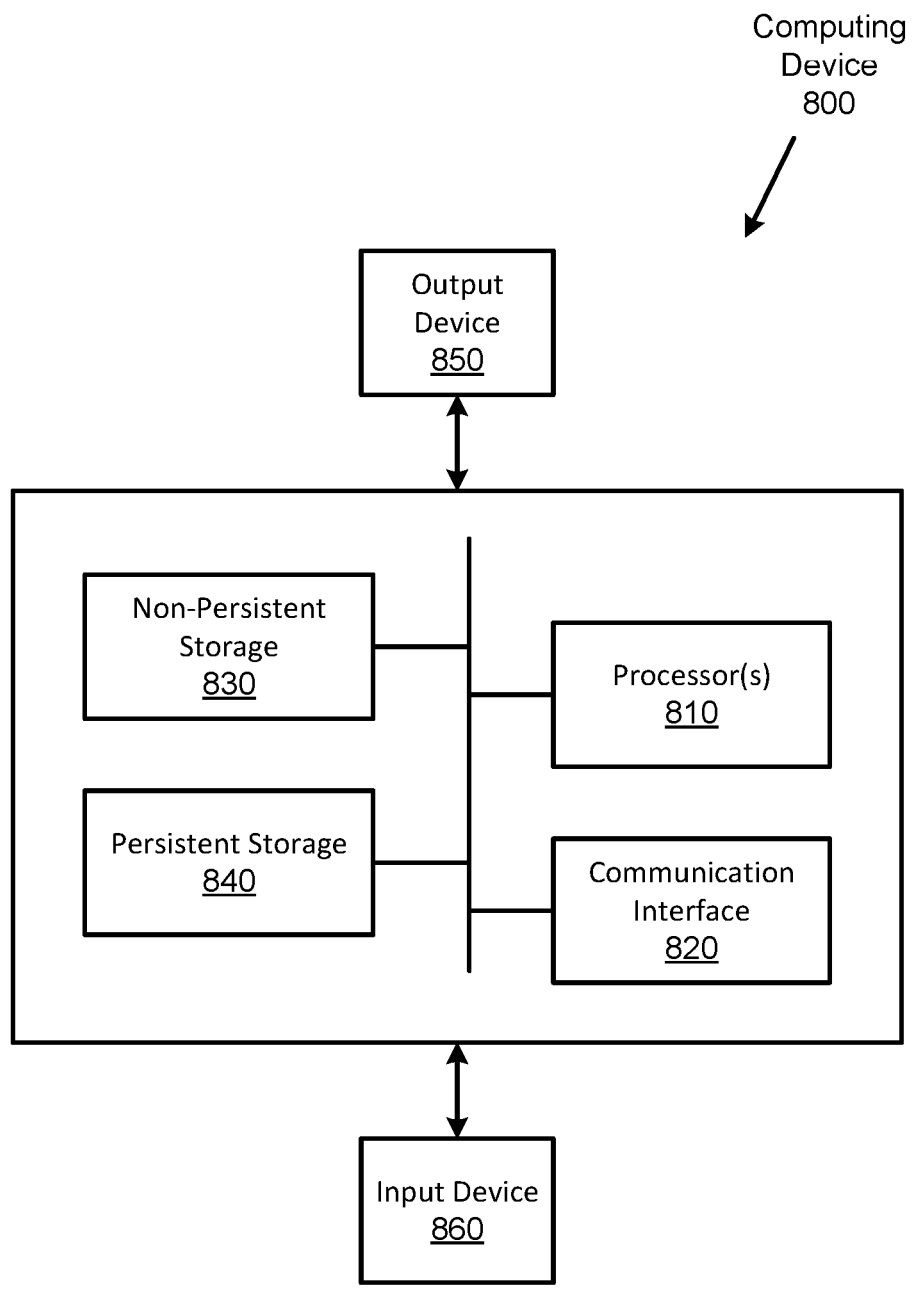
FIG. 8 shows a diagram of a computing device in accordance with one or more embodiments of the invention.

Additionally, as discussed above, embodiments of the invention may be implemented using a computing device. FIG. 8 shows a diagram of a computing device in accordance with one or more embodiments of the invention. The computing device (800) may include one or more computer processors (810), non-persistent storage (830) (e.g., volatile memory, such as random access memory (RAM), cache memory), persistent storage (840) (e.g., a hard disk, an optical drive such as a compact disk (CD) drive or digital versatile disk (DVD) drive, a flash memory, etc.), a communication interface (820) (e.g., Bluetooth interface, infrared interface, network interface, optical interface, etc.), input devices (860), output devices (850), and numerous other elements (not shown) and functionalities. Each of these components is described below.

In one embodiment of the invention, the computer processor(s) (810) may be an integrated circuit for processing instructions. For example, the computer processor(s) may be one or more cores or micro-cores of a processor. The computing device (800) may also include one or more input devices (860), such as a touchscreen, keyboard, mouse, microphone, touchpad, electronic pen, or any other type of input device. Further, the communication interface (820) may include an integrated circuit for connecting the computing device (800) to a network (not shown) (e.g., a local area network (LAN), a wide area network (WAN) such as the Internet, mobile network, or any other type of network) and/or to another device, such as another computing device.

In one embodiment of the invention, the computing device (800) may include one or more output devices (850), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (810), non-persistent storage (830), and persistent storage (840). Many different types of computing devices exist, and the aforementioned input and output device(s) may take other forms.

Embodiments of the invention may provide an improved method for heating and/or cooling an electronic device such as an information handling system (100), when internal temperatures are outside of safe operating ranges. To do so, the system selectively heats or cools each zone of the electronic device. This may be done by individual heaters and/or cooling system for each separate zones. Alternatively, or in addition too, the system can selectively open and close baffles, causing fresh ambient air to enter and/or recirculate heated air in a device's enclosure. This keeps sensitive components of the computing device, such as processors and memory from suffering damage, by operating them at temperatures that are either too cold or too warm.

Thus, embodiments of the invention may address the problem of heating and cooling specific components of a device which have different preferred operating range and/or heat at different rates.

The problems discussed above should be understood as being examples of problems solved by embodiments of the invention disclosed herein and the invention should not be limited to solving the same/similar problems. The disclosed invention is broadly applicable to address a range of problems beyond those discussed herein.

One or more embodiments of the invention may be implemented using instructions executed by one or more processors of the data management device. Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A method for heating and cooling an electronic device, comprising:
    establishing a plurality of temperature zones in the electronic device, wherein the plurality of temperature zones comprises a first temperature zone and a second temperature zone;
    making a first determination that a temperature in the first temperature zone is below a threshold;
    in response to the first determination:
        closing a front baffle and a rear baffle in the electronic device, wherein the first temperature zone and the second temperature zone are located between the front baffle and rear baffle;
        activating, after the closing, a heating device in the second temperature zone;
        activating a fan in the electronic device to recirculate air within an internal environment of the electronic device, wherein the internal environment comprises the first temperature and the second temperature zones; and
        modifying an orientation of an internal baffle to direct the recirculated air to the first temperature zone.

2. An electronic device comprising:
    a plurality of temperature zones, wherein the plurality of temperature zones comprises a first temperature zone and a second temperature zone;
    at least one heating device;
    at least one cooling device;
    a processor that controls the at least one heating device and the at least one cooling device; and
    a memory having computer program instructions stored thereon, the processor executing the computer program instructions in the memory to perform a method comprising of:
        making a first determination that a temperature in the first temperature zone is below a threshold;
        in response to the first determination:
            closing a front baffle and a rear baffle in the electronic device, wherein the first temperature zone and the second temperature zone are located between the front baffle and rear baffle;

activating, after the closing, a heating device in the second temperature zone;

activating a fan in the electronic device to recirculate air within an internal environment of the electronic device, wherein the internal environment comprises the first temperature and the second temperature zones; and modifying an orientation of an internal baffle to direct the recirculated air to the first temperature zone.

3. A non-transitory computer readable medium comprising computer readable program code, which when executed by a computer processor enables the computer processor to perform a method comprising:

establishing a plurality of temperature zones in an electronic device, wherein the plurality of temperature zones comprises a first temperature zone and a second temperature zone;

making a first determination that a temperature in the first temperature zone is below a threshold;

in response to the first determination:

closing a front baffle and a rear baffle in the electronic device, wherein the first temperature zone and the second temperature zone are located between the front baffle and rear baffle;

activating, after the closing, a heating device in the second temperature zone;

activating a fan in the electronic device to recirculate air within an internal environment of the electronic device, wherein the internal environment comprises the first temperature and the second temperature zones; and modifying an orientation of an internal baffle to direct the recirculated air to the first temperature zone.

* * * * *